(12) United States Patent
Omae et al.

(10) Patent No.: US 7,495,524 B2
(45) Date of Patent: Feb. 24, 2009

(54) IMPEDANCE MATCHING APPARATUS

(75) Inventors: Shuji Omae, Osaka (JP); Shinichi Negi, Osaka (JP); Kosuke Maeda, Osaka (JP)

(73) Assignee: Daihen Corporation, Osaka (JP)

( * ) Notice: Subject to any disclaimer, the term of this patent is extended or adjusted under 35 U.S.C. 154(b) by 185 days.

(21) Appl. No.: 11/687,912

(22) Filed: Mar. 19, 2007

(65) Prior Publication Data

US 2007/0229181 A1    Oct. 4, 2007

(30) Foreign Application Priority Data

Mar. 31, 2006    (JP)    ............... 2006-100992

(51) Int. Cl.
*H03H 7/38*    (2006.01)
(52) U.S. Cl. .................. 333/17.3; 315/111.21
(58) Field of Classification Search ............... 333/17.3, 333/32, 99 PL; 315/111.21
See application file for complete search history.

(56) References Cited

U.S. PATENT DOCUMENTS 6,946,847 B2 * 9/2005 Nishimori et al. ........... 324/600
2005/0184922 A1 * 8/2005 Ida et al. ..................... 343/861

FOREIGN PATENT DOCUMENTS

JP    6-11528    1/1994

OTHER PUBLICATIONS

English language Abstract of JP 6-11528.

* cited by examiner

*Primary Examiner*—Stephen E Jones
(74) *Attorney, Agent, or Firm*—Greenblum & Bernstein, P.L.C.

(57) ABSTRACT

An impedance matching apparatus has: a storing portion 70 for previously storing, for plural positions which can be taken by a movable portion of a variable impedance element, allowable power values respectively corresponding to the plural positions of the movable portion; and an abnormality determining portion 80 for determining an allowable power value based on the present positions of the movable portion supplied from position detecting portions 41, 42 and the allowable power values stored in the storing portion 70, for comparing the allowable power value with an input power value, and for determining that it is abnormal when the input power value is larger than the allowable power value. Accordingly, the calculation load during the matching operation can be reduced.

8 Claims, 4 Drawing Sheets

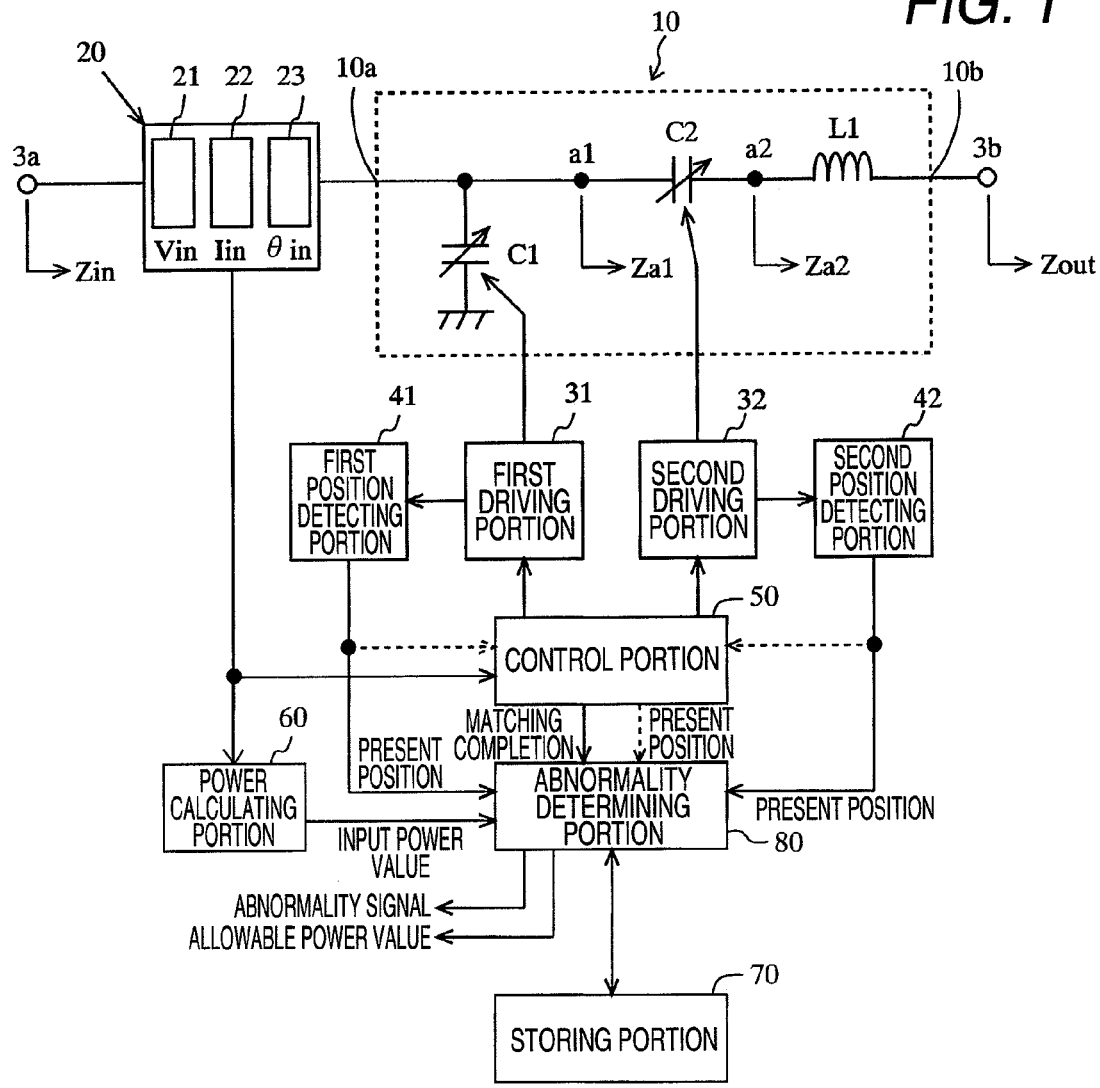

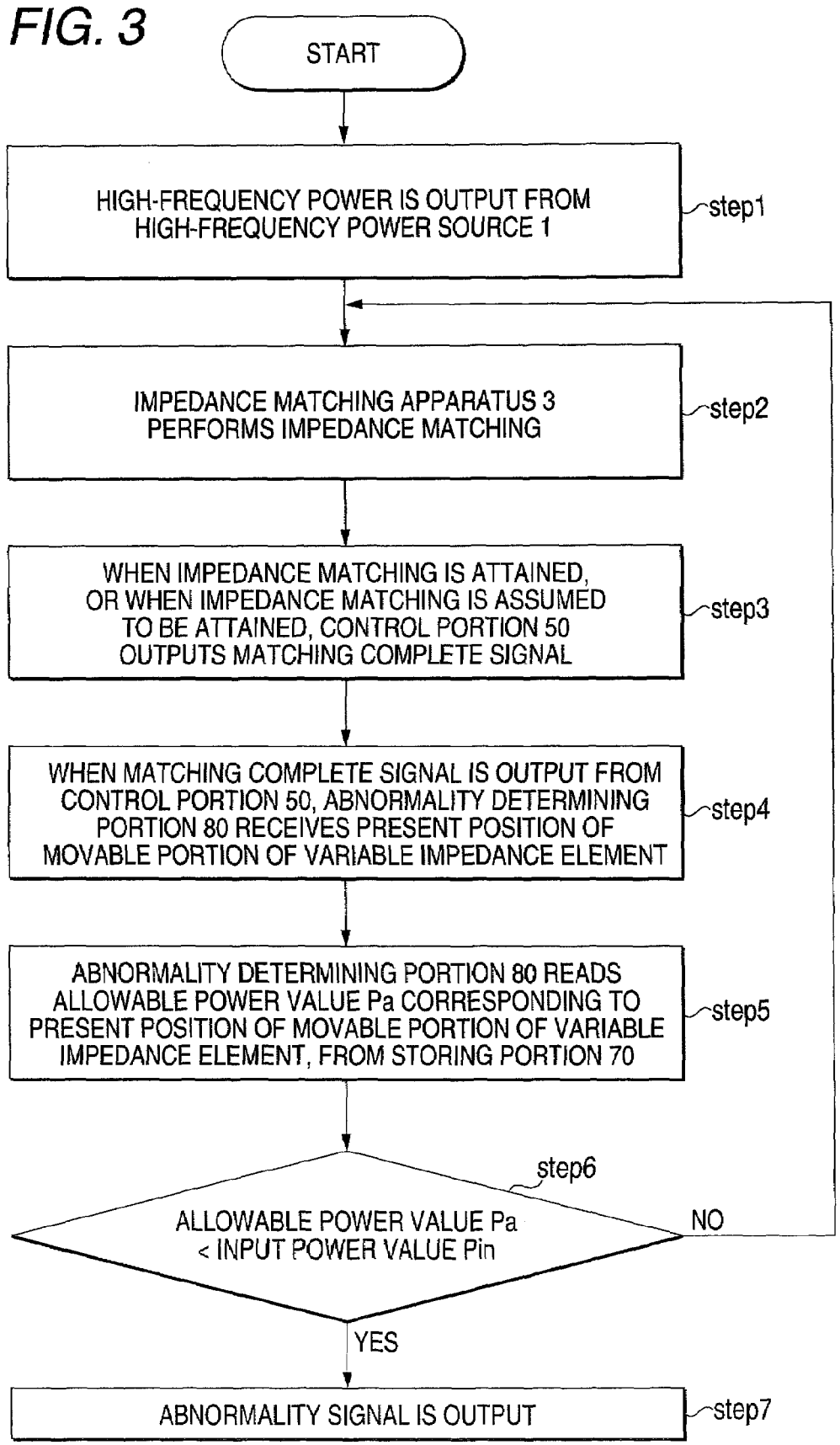

|  | C2 | | | | | | | | | | |
|---|---|---|---|---|---|---|---|---|---|---|---|
|  |  | 0 | 10 | 20 | 30 | 40 | 50 | 60 | 70 | 80 | 90 | 100 |
| C1 | 0 | 1000 | 1000 | 1000 | 1000 | ... | ... | ... | ... | 800 | 800 | 800 |
|  | 10 | 1000 | 1000 | 1000 | 1000 | ... | ... | ... | ... | 800 | 800 | 800 |
|  | 20 | 1000 | 1000 | 900 | 900 | ... | ... | ... | ... | 700 | 700 | 700 |
|  | 30 | 1000 | 900 | 900 | 900 | ... | ... | ... | ... | 700 | 700 | 700 |
|  | 40 | ... | ... | ... | ... | ... | ... | ... | ... | ... | ... | ... |
|  | 50 | ... | ... | ... | ... | ... | ... | ... | ... | ... | ... | ... |
|  | 60 | ... | ... | ... | ... | ... | ... | ... | ... | ... | ... | ... |
|  | 70 | ... | ... | ... | ... | ... | ... | ... | ... | ... | ... | ... |
|  | 80 | 800 | 800 | 800 | 800 | ... | ... | ... | ... | 600 | 600 | 600 |
|  | 90 | 800 | 800 | 800 | 800 | ... | ... | ... | ... | 600 | 600 | 600 |
|  | 100 | 800 | 800 | 800 | 800 | ... | ... | ... | ... | 600 | 600 | 600 |

IMPEDANCE MATCHING APPARATUS

BACKGROUND

1. Technical Field

The present invention relates to an impedance matching apparatus disposed between a high-frequency power source for supplying a power to a load such as a plasma treating processing apparatus used for plasma etching, plasma CVD, or the like, and the load, and for matching an impedance of the high-frequency power source and that of the load.

2. Related Art

FIG. 5 is a diagram showing an example of a high-frequency power supply system in which an impedance matching device is used.

The high-frequency power supply system is a system for performing processing such as plasma etching, or plasma CVD on a workpiece such as a semiconductor wafer or a liquid crystal substrate, and configured by a high-frequency power source 1, a transmission line 2, an impedance matching apparatus 3, a load connecting portion 4, and a load 5 (plasma treating processing apparatus 5).

The high-frequency power source 1 is an apparatus for outputting a high-frequency power, and for supplying the high-frequency power to the plasma treating processing apparatus 5 which functions as the load 5. The high-frequency power output from the high-frequency power source 1 is supplied to the load 5 through the transmission line 2 formed by a coaxial cable, the impedance matching apparatus 3, and the load connecting portion 4 configured by shielded copper plates. The high-frequency power source 1 of this type generally outputs a high-frequency power of a frequency of the radio-frequency band (for example, a frequency of several hundreds of kHz or higher).

The load 5 (plasma treating processing apparatus 5) is an apparatus comprising a processing portion for processing (etching, CVD, or the like) a workpiece such as a wafer, or a liquid crystal substrate carried into the inside of the processing portion. In order to process the workpiece, a plasma discharge gas is introduced into the processing portion, and the high-frequency power (voltage) supplied from the high-frequency power source 1 is applied to the plasma discharge gas, thereby producing a discharge in the plasma discharge gas to change the condition from a non-plasma condition to a plasma condition. Then, the workpiece is processed by using the plasma.

The impedance matching apparatus 3 matches the impedance of the high-frequency power source 1 and that of the load 5. In the impedance matching apparatus 3, a matching portion 10 (see FIG. 6) including a variable impedance element or the like in which the impedance is variable, such as a variable capacitor, or a variable inductor is provided. The impedance of the variable impedance element of the matching portion 10 (in more detail, a capacitance in the case of a variable capacitor, and an inductance in the case of a variable inductor) is changed, thereby performing the impedance matching.

More specifically, for example, when the impedance viewed from an output terminal of the high-frequency power source 1 toward the high-frequency power source 1 is designed to be 50 Ω, and the high-frequency power source 1 is connected to an input terminal 3a of the impedance matching apparatus 3 via the transmission line 2 having a characteristic impedance of 50 Ω, the impedance matching apparatus 3 converts an impedance Zin (hereinafter, referred to as an input impedance Zin) viewed from the input terminal 3a of the impedance matching apparatus 3 toward the load 5, to 50 Ω.

At this time, for example, a range of 50 Ω±1 Ω is set. When the value of the impedance falls in the range, the impedance matching may be assumed to be attained. The target impedance is not limited to 50 Ω, but another impedance (for example, 51 Ω) can be intentionally set.

In the matching portion 10 of the impedance matching apparatus 3, at least one variable impedance element is disposed. Alternatively, another type of element, such as a capacitor or an inductor in which the impedance is fixed may be disposed.

FIG. 6 shows an exemplary circuit configuration of the matching portion 10.

As shown in FIG. 6, the matching portion 10 is configured by, for example, a first variable capacitor C1, a second variable capacitor C2, and an inductor L1.

The first variable capacitor C1 and the second variable capacitor C2 are capacitors in which the capacitance is variable. The first variable capacitor C1 and the second variable capacitor C2 have movable portions which are not shown in the figure, respectively. When the position of the movable portion is changed, the capacitance can be varied. That is, the first variable capacitor C1 and the second variable capacitor C2 are a type of variable impedance elements. The inductor L1 is an inductor having a fixed inductance disposed between the second variable capacitor C2 and an output terminal 10b.

As shown in FIG. 1 which will be described later, an input-terminal information detecting portion 20 is disposed between the input terminal 3a of the impedance matching apparatus 3 and an input terminal 10a of the matching portion 10. In the specification, however, electric characteristics at the input terminal 3a of the impedance matching apparatus 3 are assumed to be substantially the same as those at the input terminal 10a of the matching portion 10. When the impedance viewed from the input terminal 3a of the impedance matching apparatus 3 toward the load 5 is the input impedance Zin, therefore, the impedance viewed from the input terminal 10a of the matching portion 10 toward the load 5 is also the input impedance Zin.

The output terminal 10b of the matching portion 10 is substantially identical with an output terminal 3b of the impedance matching apparatus 3. When the impedance viewed from the output terminal 3b of the impedance matching apparatus 3 toward the load 5 is an output impedance Zout, therefore, the impedance viewed from the output terminal 10b of the matching portion 10 toward the load 5 is also the output impedance Zout.

In the case of the impedance matching apparatus 3 comprising the above-described matching portion 10, at the input terminal 10a of the matching portion 10 (substantially identical with the input terminal 3a of the impedance matching apparatus 3), both the voltage and the current are not abnormally raised. At the output terminal 10b of the matching portion 10, however, the voltage may be sometimes raised abnormally, as compared with the input terminal 10a. This may cause a discharge trouble. At the output terminal 10b of the matching portion 10, a large current flows, so that a breakage caused by heat generation may occur.

Therefore, an element disposed on the output side of the matching portion 10 such as the second variable capacitor C2 and the inductor L1 is required to be designed so as to withstand a high voltage and a high current. Actually, however, an element having a limited withstand voltage value, and a limited withstand current value in the range which satisfies the specifications required by the customer is selected for the purposes of miniaturization, light-weight, and reduction of production cost. This is because, if an element is selected by estimating a possible maximum value, the size and weight of the element are increased, and also the production cost is increased, so that such an element is impractical.

For this reason, the customer performs the setting of an output power value output from the high-frequency power source 1, or the like so as not to exceed the required specifications. The reason of this is that a voltage and current at the output terminal 10b can be varied by changing the output power value. If the power setting or the like which exceeds the required specifications is erroneously performed by any chance, however, there is the possibility that an element of the matching portion 10 is broken by a voltage exceeding the withstand voltage value of the element, or by a current exceeding the withstand current value.

As a countermeasure against the above, as disclosed in JP-A-6-11528, a voltage at the output terminal 10b is calculated, and the calculated voltage value is monitored. By using this technique, when the calculated voltage value becomes equal to or larger than a predetermined value, it is possible to determine that it is abnormal. In the case where the abnormality is detected, for example, the output of the high-frequency power source 1 is stopped, thereby preventing the element of the matching portion 10 from being broken.

Patent Reference 1: JP-A-6-11528

In the above-described method in which the voltage at the output terminal 10b of the matching portion 10 is calculated, thereby determining whether it is abnormal or not in order to prevent breakage of the element of the matching portion 10 from occurring, the following problems arise.

(1) The voltage at the output terminal 10b is obtained, but the current cannot be uniquely obtained. The current changes also depending on the output impedance Zout. When this method is used, therefore, it is impossible to determine whether a current which exceeds the withstand current value of the element flows or not.

(2) Only the voltage at the output terminal 10b of the matching portion 10 is calculated, so that the abnormality decision for elements existing between the input terminal 10a and the output terminal 10b of the matching portion 10 cannot be performed. In the case of the matching portion 10 shown in FIG. 6, for example, the abnormality determination for the variable capacitor C1 cannot be performed. In addition, as for the variable capacitor C2, it is impossible to determine whether the voltage across applied to the both ends of the element exceeds the withstand voltage value or not.

(3) As described in JP-A-6-11528, the output impedance Zout at the output terminal 10b can be calculated. By applying this method, it is possible to calculate a voltage and a current individually for respective elements of the matching portion 10. However, the impedance of the variable impedance element of the matching portion 10 is not constant, and the output power value and the like of the high-frequency power source are not constant. Therefore, it is necessary to perform the calculation depending on the conditions at the time. However, the calculation requires many calculation steps, so that the calculation during the matching operation requires a large calculation load.

SUMMARY

It is an object of the invention to provide an impedance matching apparatus for determining that it is abnormal when a voltage exceeding the withstand voltage value occurs, or when a current exceeding the withstand current value flows in elements of the matching portion 10 including not only the output terminal 10b of the matching portion 10 but also elements existing between the input terminal 10a and the output terminal 10b of the matching portion 10, with a small calculation load required for the determination.

An impedance matching apparatus 3 provided by a first invention is an impedance matching apparatus, disposed between a high-frequency power source for outputting a high-frequency power and a load, for matching an impedance of the high-frequency power source and an impedance of the load, the apparatus comprising:

a matching unit that includes at least one variable impedance element in which an impedance can be varied by changing a position of a movable portion;

a driving unit that is disposed for each of the variable impedance element and changes the position of the movable portion of the variable impedance element in plural steps within a movable range;

a controlling unit that varies the impedance of the variable impedance element by controlling the driving unit, thereby matching the impedance of the high-frequency power source and the impedance of the load;

an input power acquiring unit that detects or calculates a power value at an input terminal of the matching unit, and outputs the power value as an input power value;

a storing unit that previously stores allowable power values respectively corresponding to intended positions in an associated manner with the positions of the movable portion, while, in a case where the matching unit includes one variable impedance element, plural positions which can be taken by the movable portion of the variable impedance element are intended, and, in a case where the matching unit includes plural variable impedance elements, combined positions of plural positions which can be taken by respective movable portions of the plural variable impedance elements are intended; and an abnormality determining unit that sets, based on a present position of the movable portion and the allowable power values stored in the storing unit, an allowable power value corresponding to the present position of the movable portion, compares the allowable power value with the input power value, and that when the input power value is larger than the allowable power value, determines that it is abnormal and outputs an abnormality signal.

In an impedance matching apparatus provided by a second invention, the storing unit previously stores allowable power values respectively corresponding to intended positions in an associated manner with the positions of the movable portion, while, in the case where the matching unit includes one variable impedance element, all of positions which can be taken by the movable portion of the variable impedance element are intended, and, in the case where the matching unit includes plural variable impedance elements, combined positions of all positions which can be taken by respective movable portions of the plurality of variable impedance elements are intended.

In an impedance matching apparatus provided by a third invention, the storing unit previously stores allowable power values respectively corresponding to intended positions in an associated manner with the positions of the movable portion, while, in the case where the matching unit includes one variable impedance element, part of positions which can be taken by the movable portion of the variable impedance element are intended, and, in the case where the matching unit includes plural variable impedance elements, combined positions of part of positions which can be taken by respective movable portions of the plurality of variable impedance elements are intended.

In an impedance matching apparatus provided by a fourth invention, in a case where an allowable power value corresponding to the present position of the movable portion is included in the allowable power values stored in the storing unit, the abnormality determining unit sets the allowable power value as an allowable power value to be compared with the input power value, and in a case where an allowable power value corresponding to the present position of the movable portion is not included in the allowable power values stored in the storing unit, the abnormality determining unit specifies plural positions adjacent to the present position of the movable portion among the positions of the movable portion stored in the storing unit, and sets a minimum value among the allowable power values corresponding to the specified positions as an allowable power value to be compared with the input power value.

In an impedance matching apparatus provided by a fifth invention, the controlling unit has a function of, when the impedance matching is attained, or when the impedance matching is assumed to be attained, outputting an impedance matching complete signal, and the abnormality determining unit functions when the impedance matching complete signal is output from the controlling unit.

In an impedance matching apparatus provided by a sixth invention, the abnormality determining unit externally outputs an allowable power value when the abnormality determining unit determines that it is abnormal, together with the abnormality signal.

In an impedance matching apparatus provided by a seventh invention, the apparatus further comprises position detecting unit, disposed for each of the variable impedance element, for detecting positional information of the movable portion of the variable impedance element, and for outputting the present position of the movable portion based on the detected positional information, and the abnormality determining unit uses the present position of the movable portion output from the position detecting unit.

In an impedance matching apparatus provided by an eighth invention, the controlling unit has a function of calculating a target position of the movable portion for controlling the driving unit, and a function of outputting the calculated target position of the movable portion as the present position of the movable portion, and the abnormality determining unit uses the present position of the movable portion output from the controlling unit.

According to the first invention, when a voltage across applied to an element such as a variable impedance element is considered to exceed a withstand voltage value, or when a flowing current is considered to exceed a withstand current value, it is possible to determine that it is abnormal. If the abnormality is determined, an appropriate process can be performed. For example, an abnormality signal is supplied to the high-frequency power source or a high-level control apparatus, so that the power output of the high-frequency power source can be stopped. Accordingly, it is possible to prevent elements such as the variable impedance element from being broken. At this time, a determination whether it is abnormal or not is performed based on the power threshold stored in the storing unit. Therefore, there is an advantage that complicated calculations for the abnormality determination are not required during the impedance matching operation.

As in the second invention, in the case where allowable power values for all of the positions which can be taken by the movable portion of the variable impedance element, or combined positions of all of the positions which can be taken by the respective movable portions of the plural variable impedance portions are stored in the storing unit, the allowable power values stored in the storing unit can be used as allowable power values to be compared with an input power value in the abnormality determining unit. Thus, the abnormality determination can easily be performed.

By contrast, in the above-described case, a very large number of allowable power values are stored in the storing unit. When there are two variable impedance elements and each movable portion can take 101 positions, for example, it is necessary to store 101×101=10,201 (about ten thousand) allowable power values. This requires a large capacity of the storing unit. Moreover, it is necessary to determine a very large number of allowable power values, so that the number of operation steps is increased.

As in the third invention, in the case where allowable power values for part of the positions which can be taken by the movable portion of the variable impedance element, or combined positions of part of the positions which can be taken by the respective movable portions of the plural variable impedance portions are stored in the storing unit, the capacity of the storing unit can be reduced, and the number of operation steps for determining the allowable power values can be reduced. However, there occurs a case where an allowable power value corresponding to the present position of the movable portion of the variable impedance element output from the position detecting unit is not in the allowable power values stored in the storing unit. In such a case, an allowable power value to be compared with the input power value in the abnormality determining unit is determined as in the fourth invention.

When the impedance matching is attained, or when impedance matching is assumed to be attained, generally, the accuracy of the power value detected by the input power acquiring unit is high. On the contrary, when the impedance matching is not attained, or when the impedance matching is not assumed to be attained, the accuracy is low. The reason is that calibration is performed in the input power acquiring unit when the impedance matching is attained, or when the impedance matching is assumed to be attained. Therefore, it is useless to perform the abnormality determination based on the input power value when the impedance matching is not attained or when the impedance matching is not assumed to be attained. Therefore, the accuracy of the abnormality determination can be increased by the fifth invention.

As in the sixth invention, when the abnormality signal, and the allowable power value at that time are externally output, it is possible to perform the control based on the output allowable power value. For example, when the allowable power value output from the abnormality determining unit is input into the high-frequency power source or a high-level control apparatus, it is possible to lower the set value for the power so that the voltage across applied to the variable impedance element does not exceed the withstand voltage value, and the flowing current does not exceed the withstand current value. Accordingly, it is possible to prevent the variable impedance element from being broken.

BRIEF DESCRIPTION OF THE DRAWINGS

FIG. 1 shows an exemplary configuration of an impedance matching apparatus 3.

FIG. 2 shows an example of allowable power values Pp stored in a storing portion 70.

FIG. 3 is a flowchart showing an abnormality determining operation in a first embodiment.

DESCRIPTION OF EXEMPLARY EMBODIMENTS

Hereinafter, the invention will be described in detail with reference to the accompanying drawings.

FIG. 1 shows an exemplary configuration of an impedance matching apparatus 3.

Figure 6:
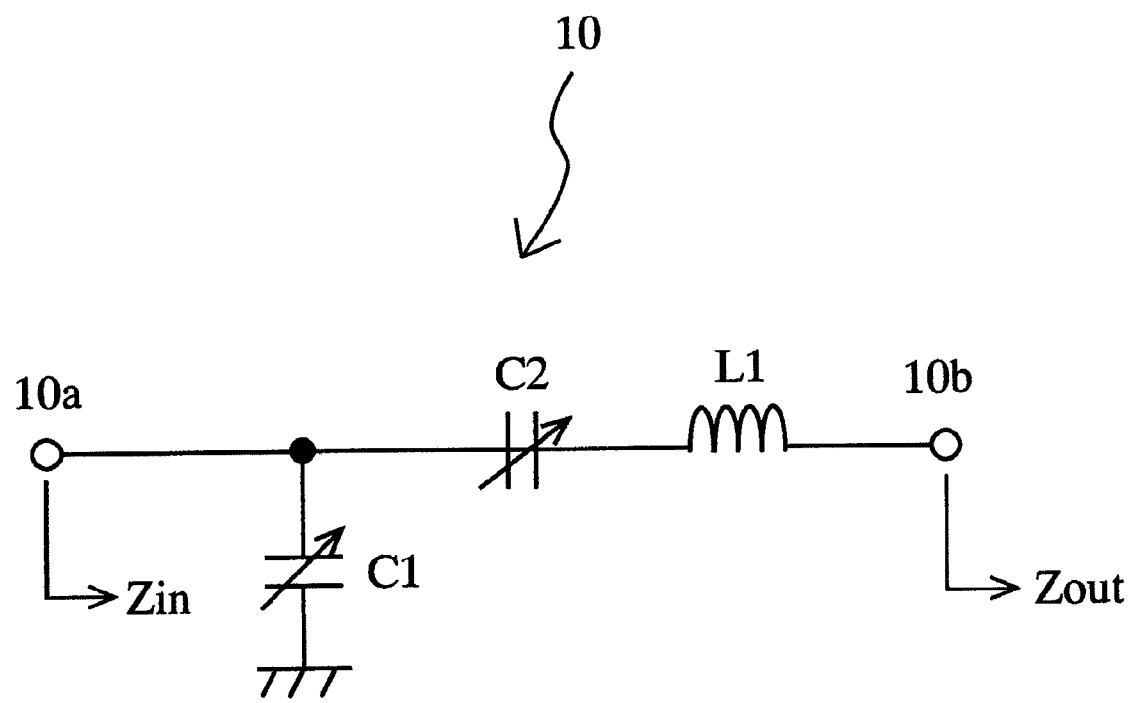
FIG. 6 is a diagram showing an exemplary circuit configuration of a matching portion 10.

A matching portion 10 is identical with that shown in FIG. 6, and therefore the description thereof is omitted. The matching portion 10 is an example of the matching unit in the invention.

At an input terminal 3a of the impedance matching apparatus 3 (substantially identical with the input terminal 10a of the matching portion 10), an input terminal information detecting portion 20 detects an input voltage Vin (e.g., an effective value), an input current Iin (e.g., an effective value), and a phase difference θin between the input voltage Vin and the input current Iin as information required for the impedance matching. In more detail, the input information detecting portion 20 is configured by a voltage detecting portion 21, a current detecting portion 22, and a phase difference detecting portion 23.

A first driving portion 31 is coupled to a first variable capacitor C1. The capacitance of the variable capacitor C1 can be changed by driving the first driving portion 31. Similarly, a second driving portion 32 is coupled to a second variable capacitor C2. The capacitance of the variable capacitor C2 can be changed by driving the second driving portion 32. As the first driving portion 31 and the second driving portion 32, for example, motors such as stepping motors or servomotors are used. The first driving portion 31 and the second driving portion 32 are examples of the driving unit in the invention.

The first driving portion 31 and the second driving portion 32 are controlled by a control portion 50 which will be described later. At this time, they are driven so that the capacitances of the first variable capacitor C1 and the second variable capacitor C2 can be changed in plural levels, respectively.

In more detail, each of the first variable capacitor C1 and the second variable capacitor C2 has a movable portion for changing the capacitance. When the position of the movable portion is changed, the capacitance can be varied. When the respective movable portions are displaced in plural positions by the first driving portion 31 and the second driving portion 32, the capacitances of the first variable capacitor C1 and the second variable capacitor C2 can be changed in plural levels. That is, the impedance of a variable impedance element can be changed in plural levels.

For example, in the case where the positions of the movable portions of the first variable capacitor C1 and the second variable capacitor C2 can be changed in 101 positions, respectively, the capacitances can be varied in 101×101=10,201 ways in combination. Namely, the impedance of the matching portion 10 can be changed in 10,201 ways in combination.

The capacitances with respect to the positions of the movable portion are known by the specifications of the variable impedance element or experiments. When the position of the movable portion is found out, therefore, the capacitance is known.

In the embodiment, as the variable impedance elements, variable capacitors such as the first variable capacitor C1 and the second variable capacitor C2 are exemplarily used. Also when a variable inductor is used as the variable impedance element, the same effects can be attained.

A first position detecting portion 41 detects positional information of the movable portion of the first variable capacitor C1, and outputs the present position of the movable portion based on the detected positional information. The positional information of the movable portion is the information which directly or indirectly indicates the position of the movable portion. In the case where the first driving portion 31 is a motor such as a stepping motor as in the embodiment, for example, the position of the movable portion of the first variable capacitor C1 is changed by the rotation of the motor. When the rotation amount of the motor is detected, therefore, the position of the movable portion can be obtained. Accordingly, the rotation amount of the motor can be used as the positional information of the movable portion. In this case, the rotation amount of the motor may be detected on the basis of a pulse signal or may be detected on the basis of a voltage, or the like.

As described above, the first driving portion 31 is coupled to the first variable capacitor C1, and therefore the positional information of the movable portion of the first variable capacitor C1 may be detected on the side of the variable impedance element, or may be detected on the side of the first driving portion 31. In the embodiment, as shown in FIG. 1, the positional information is detected on the side of the first driving portion 31.

Similarly, the second position detecting portion 42 detects the positional information of the movable portion of the second variable capacitor C2, and outputs the present position of the movable portion based on the detected positional information. The second position detecting portion 42 is identical with the first position detecting portion 41, and therefore the description thereof is omitted. The first position detecting portion 41 and the second position detecting portion 42 are examples of the position detecting unit in the invention.

A control portion 50 performs the impedance matching based on the information detected by the input terminal information detecting portion 20 so that the input impedance Zin becomes a predetermined value. Therefore, the control portion 50 supplies an instruction signal to the first driving portion 31 and the second driving portion 32 so as to perform the impedance matching, thereby changing the capacitances of the first variable capacitor C1 and the second variable capacitor C2. At this time, feedback control may be performed by inputting the present positions of the movable portions supplied from the first position detecting portion 41 and the second position detecting portion 42.

The control portion 50 has a function of calculating a target position of the movable portion. Thus, the target position may be output as the present position, and supplied to an abnormality determining portion 80 which will be described later.

When the impedance matching is attained, or when the impedance matching is assumed to be attained, a matching complete signal is supplied to the abnormality determining portion 80 which will be described later.

The control portion 50 is an example of the controlling unit in the invention. The method of impedance matching is known, and hence the description thereof is omitted. In the embodiment, the input terminal information detecting portion 20 detects a voltage, a current, and a phase difference, and the impedance matching is performed based on the information. However, the invention is not restricted to the method. For example, the impedance matching may be performed in the following manner. A forward wave voltage and a reflected wave voltage are detected, and the impedance matching is performed based on the detected forward wave voltage and reflected wave voltage.

A power calculating portion 60 calculates a power value at the input terminal 10a based on the information detected by the input terminal information detecting portion 20, and outputs the calculated power value as an input power value Pin. The input power value Pin is expressed by following Expression (1):

$$Pin = Vin \cdot Iin \cdot \cos(\theta in) \quad (1)$$

Alternatively, a power detecting device may be disposed at the input terminal 3a of the impedance matching apparatus 3 in addition to the input terminal information detecting portion 20, and the input power value Pin detected by the power detecting device may be output. The power calculating portion 60 and the power detecting device are examples of the input power acquiring unit in the invention.

A storing portion 70 previously stores, for combined positions of plural positions which can be taken by the respective movable portions of the first variable capacitor C1 and the second variable capacitor C2, allowable power values Pp corresponding to the respective positions, in an associated manner with the positions. The storing portion 70 will be described later in detail. The storing portion 70 is an example of the storing unit in the invention.

The abnormality determining portion 80 determines an allowable power value Pap corresponding to the present positions of the movable portions based on the present positions of the movable portions output from the first position detecting portion 41 and the second position detecting portion 42 and the allowable power values Pp stored in the storing portion 70, and compares the allowable power value Pap with the input power value Pin supplied from the power calculating portion 60. When the input power value Pin is larger than the allowable power value Pap, the abnormality determining portion 80 determines that it is abnormal, and outputs an abnormality signal. The abnormality determining portion 80 is an example of the abnormality determining unit in the invention.

Next, the allowable power values Pp stored in the storing portion 70 will be described.

The allowable power values Pp stored in the storing portion 70 are stored correspondingly to the combined positions of the plural positions which can be taken by the respective movable portions of the first variable capacitor C1 and the second variable capacitor C2. The allowable power values Pp stored in the storing potion 70 indicate allowable values of power output from the high-frequency power source 1. Namely, when the power value supplied from the high-frequency power source 1 is equal to or smaller than the stored allowable power value Pap, the voltage applied on either one of the variable impedance elements of the matching portion 10 does not exceed the withstand voltage value, and the flowing current does not exceed the withstand current value. Therefore, the variable impedance element can be prevented from being broken.

FIG. 2 shows an example of allowable power values Pp stored in the storing portion 70.

The allowable power values Pp (unit: W) shown in FIG. 2 are obtained in the case where the variable impedance elements disposed in the matching portion 10 are the first variable capacitor C1 and the second variable capacitor C2. In FIG. 2, numerals 0 to 100 in the section of C1 are the numbers assigned to the positions of the movable portion of the first variable capacitor C1. In this example, the numeral "0" in the section of C1 indicates that the movable portion of the first variable capacitor C1 is in a reference position (a minimum value, for example). The numeral "1" in the section of C1 indicates that the position of the movable portion of the first variable capacitor C1 is changed by one location with respect to the reference position. The numeral "100" indicates that the position of the movable portion of the first variable capacitor C1 is changed by 100 locations with respect to the reference position. Similarly, the numerals "0" to "100" in the section of C2 are the numbers assigned to the positions of the movable portion of the second variable capacitor C2. In this example, these numerals indicate the positions of the movable portions.

Specifically, in this example, the positions of the movable portions of the first variable capacitor C1 and the second variable capacitor C2 can be changed in 0 to 100 locations, respectively. Accordingly, each movable portion can take 101 positions, and the combined number, that is, 101×101=10, 201 allowable power values Pp can be stored in an associated manner with the positions of the movable portions. In FIG. 2, in order to simplify the figure, some columns are omitted.

Therefore, for example, when the position of the movable portion of the variable capacitor C1 is "2", and the position of the movable portion of the variable capacitor C2 is "3", the corresponding allowable power value Pap is "900 W". That is, the allowable power value corresponding to the combined position "2, 3" which is obtained by combining the position "2" of the movable portion of the variable capacitor C1 and the position "3" of the movable portion of the variable capacitor C2 is "900 W".

Next, the method of determining the allowable power value Pap is described by taking the matching portion 10 shown in FIG. 1 as an example.

When the circuit constants of the matching portion 10 are determined, and the input power value Pin is found, voltages and currents in respective portions of the matching portion 10 can be obtained by calculations. Therefore, the allowable power values Pp corresponding to the positions of the respective movable portions can be previously obtained by calculations.

For example, we consider the case where the present positions of the movable portions of the first variable capacitor C1 and the second variable capacitor C2 are (C1, C2)=(0, 0) at the present time, and the input power value Pin is a rated output value (e.g., 1,000 W) of the high-frequency power source. As described above, the capacitance with respect to the position of the movable portion is known by the specifications of the variable impedance element or experiments. Therefore, a voltage and a current in respective portion of the matching portion 10 can be obtained by calculations.

Here, the withstand voltage value and the withstand current value of the element in the matching portion 10 are known.

Therefore, it is possible to determine whether the calculated results exceed the withstand voltage values and the withstand current values of all of the elements in the matching portion 10 or not. At this time, when the calculated results exceed the withstand voltage value and the withstand current value of any one of the elements in the matching portion 10, the input power value Pin is not allowable.

In this case, the input power value Pin is lowered by a predetermined power value, and the calculation is performed again similarly. For example, the value is lowered by 100 W, and the calculation is performed by using the value of 900 W. Finally, the power value which does not exceed the withstand voltage values and the withstand current values of all of the elements in the matching portion 10 is the allowable power value Pap for (C1, C2)=(0, 0).

Such a calculation is performed in sequence for the case (C1, C2)=(0, 1), for the case (C1, C2)=(0, 2), and the like, thereby obtaining allowable power values corresponding to the combined positions of all of the positions which can be taken by the respective movable portions of the plural variable impedance elements.

Instead of the above-described case where the determination whether the values exceed the withstand voltage value and the withstand current value or not is performed for all of the elements in the matching portion 10, the determination may be performed for a specified element. For example, the matching portion 10 in FIG. 1 will be exemplarily used. The determination whether the values exceed the withstand voltage values and the withstand current values or not is performed for the variable capacitor C1 and the variable capacitor C2, but the determination may not be performed for the inductor L1.

(Calculation Example of Voltage and Current)

The calculation of a voltage and a current in each portion of the matching portion 10 is performed in the following manner.

For example, the case where a frequency f of the high-frequency power output from the high-frequency power source 1 is 13.56 [MHz], the input power value Pin is 1 [kW], and it is assumed that there is no power loss in the matching portion 10 will be described.

The input impedance Zin in FIG. 1 is expressed by Expression (2). The current at the input terminal is expressed by Expression (3), and the voltage at the input terminal is expressed by Expression (4).

$$Zin = Rin + jXin \quad (2)$$

$$Iin = \sqrt{(Pin/Rin)} \quad (3)$$

$$Vin = Iin \times |Zin| \quad (4)$$

When the input impedance Zin is 50 [Ω], for example, the current at the input terminal is about 4.5 [A]. The voltage at the input terminal is about 224 [V].

The impedance of the variable capacitor C1 is expressed by Expression (5). In Expression (5), "C1" is used for indicating the capacitance.

$$-jXc1 = -j/(\omega(C1)) = -j/(2\pi f(C1)) \quad (5)$$

in the case where the capacitance of the first variable capacitor C1 is 1,000 [pF] when the input impedance Zin is 50 [Ω], for example, the impedance (−jXc1) of the variable capacitor C1 is −j11.7 [Ω]. Therefore, a current of 19.1 [A] flows through the variable capacitor C1.

Next, an admittance Ya1 viewed from a point (a1) between the first variable capacitor C1 and the second variable capacitor C2 in FIG. 1 toward the load 5 is expressed by Expression (6). Therefore, the impedance Za1 viewed from the point a1 toward the load 5 is expressed by Expression (7). As in Expression (8), the impedance Za1 is expressed by a resistance Ra1 and a reactance Xa1. An absolute value |Za1| of the impedance Za1 at the point a1 is expressed by Expression (9).

$$Ya1 = 1/Zin - 1/(-jXc1) \quad (6)$$

$$Za1 = 1/Ya1 \quad (7)$$

$$Za1 = Ra1 + jXa1 \quad (8)$$

$$|Za1| = \sqrt{(Ra1^2 + Xa1^2)} \quad (9)$$

For example, in the case where the capacitance of the first variable capacitor C1 is 1,000 [pF] when the input impedance Zin is 50 [Ω], the impedance Za1 is 2.6+j11.1 [Ω]. The absolute value |Za1| of the impedance Za1 is 11.4 [Ω]. Therefore, a current of about 19.6 [A] flows through the second variable capacitor C2 and the inductor L1.

The impedance of the variable capacitor C2 is expressed by Expression (10). In Expression (10), "C2" is used for indicating the capacitance.

$$-jXc2 = -j/(\omega(C2)) = -j/(2\pi f(C2)) \quad (10)$$

For example, when the capacitance of the second variable capacitor C2 is 100 [pF], the impedance (−jXc2) of the variable capacitor C2 is about −j117 [Ω]. At this time, when the current flowing through the variable capacitor C2 is 19.6 [A], a potential difference of about 2,290 [V] is produced across at the ends of the variable capacitor C2.

The impedance Za2 viewed from a point (a2) between the second variable capacitance C2 and the inductor L1 toward the load 5 in FIG. 1 is expressed by Expressions (11) to (13). An absolute value |Za2| of the impedance at the point a2 is expressed by Expression (14).

$$Za2 = Ra2 + jXa2 \quad (11)$$

$$Ra2 = Ra1 \quad (12)$$

$$jXa2 = jXa1 - (-jXc2) \quad (13)$$

$$|Za2| = \sqrt{(Ra2^2 + Xa2^2)} \quad (14)$$

For example, in the above-mentioned example, the impedance Za2 is 2.6+j128.1 [Ω]. Therefore, the absolute value |Za2| at the point a2 is 128.1 [Ω]. Accordingly, the voltage Va2 at the point a2 is about 2,510 [V], which is very high.

The impedance of the inductor L1 is expressed by Expression (15). In Expression (15), "L1" is used for indicating the inductance.

$$jXL1 = j\omega(L1) = j2\pi f(L1) \quad (15)$$

When the inductance of the inductor L1 is 1 [μH], for example, the impedance (jXL1) of the inductor L1 is j85.2 [Ω].

Therefore, a potential difference of about 1,670 [V] is produced across at the ends of the inductor L1.

The output impedance Zout in FIG. 1 is expressed by Expressions (16) to (18). An absolute value |Zout| of the impedance at the output terminal is expressed by Expression (19).

$$Zout = Rout + jXout \quad (16)$$

$$Rout = Ra1 \quad (17)$$

$$jXout = jXa2 - (jXL1) \quad (18)$$

$$|Zout| = \sqrt{(Rout^2 + Xout^2)} \quad (19)$$

For example, in the above-mentioned example, the output impedance Zout is 2.6+j42.9 [Ω]. Therefore, the absolute value |Zout| of the impedance at the output terminal is 43.0 [Ω]. Accordingly, the voltage Vout at the output terminal is about 840 [V].

As described above, when the circuit constants of the matching portion 10 are determined, and the input power value Pin is found, voltages and currents in respective portions of the matching portion 10 can be obtained by calculations. Then, the calculated results are determined whether they exceed the withstand voltage values and the withstand current values of the respective elements, or not. For example, in the above-mentioned exemplary calculations, a potential difference of about 2,290 [V] is produced across at the variable capacitor C2. It is sufficient to determine whether the potential difference exceeds the withstand voltage value of the variable capacitor C2 or not. As a result of the determination, if the potential difference exceeds the withstand voltage value, the input power value Pin used for the calculation is lowered, and the same calculation is performed again. In the above-mentioned example, for example, the provisional power value of 1,000 W is lowered to 900 W, and the calculation is performed.

As the lowering amount of the power value is smaller, the allowable power values Pp can be set more finely, but the number of calculations is increased. On the contrary, as the lowering amount of the power value is larger, the allowable power values Pp are set more roughly, but the number of calculations is decreased. Therefore, the lowering amount may be appropriately determined depending on the conditions. In any cases, the allowable power values Pp are previously stored, and hence the calculation load during the matching operation is small.

Actually, there exist somewhat resistant components in the variable impedance elements and the wiring of the matching portion 10, so that there occurs power loss in the matching portion 10. Therefore, the voltage and the current are lower than those in the above-described example. Accordingly, the allowable power values Pp may be determined in view of the power loss.

FIG. 3 is a flowchart showing an abnormality determining operation in the first embodiment. Hereinafter, the operation will be described with reference to the flowchart.

Step 1: A high-frequency power is output from the high-frequency power source 1. If an instruction of changing an output power value is supplied from a high-level control apparatus, or the like, the output power value is changed for each instruction.

Step 2: The impedance matching apparatus 3 performs the impedance matching.

Step 3: When the impedance matching is attained, or when the impedance matching is assumed to be attained, the control portion 50 outputs a matching complete signal.

Step 4: When the matching complete signal is output from the control portion 50, the abnormality determining portion 80 receives the present position of the movable portion of the variable impedance element.

Step 5: The abnormality determining portion 80 reads the allowable power value Pap corresponding to the present position of the movable portion of the variable impedance element, from the storing portion 70.

Step 6: The abnormality determining portion 80 compares the read allowable power value Pap with the input power value Pin calculated in the power calculating portion 60. If the allowable power value Pap<the input power value Pin, it is determined to be abnormal, and the process proceeds to Step 7. If the allowable power value Pap≧the input power value Pin, the process returns to Step 2, and the process is repeated.

Step 7: When it is determined to be abnormal in Step 6, the abnormality signal is output.

According to the configuration, even in the case where an excessive power exceeding the required specifications is output from the high-frequency power source 1, it is possible to prevent the variable impedance elements from being broken. When the abnormality signal is input into the high-frequency power source 1, for example, the output of the high-frequency power is stopped, thereby preventing the breakage.

In Step 75, when the allowable power value Pap at the time is externally output together with the abnormality signal, the control can be performed based on the output allowable power value Pap. For example, by inputting the allowable power value Pap output from the abnormality determining portion 80 into the high-frequency power source 1 or the high-level control apparatus, the set value of the power can be lowered so that the voltage across applied to the variable impedance element does not exceed the withstand voltage value, and the flowing current does not exceed the withstand current value. Therefore, it is possible to prevent the variable impedance elements for being broken, without stopping the output of the high-frequency power source 1.

Second Embodiment

Figures 4, 5:
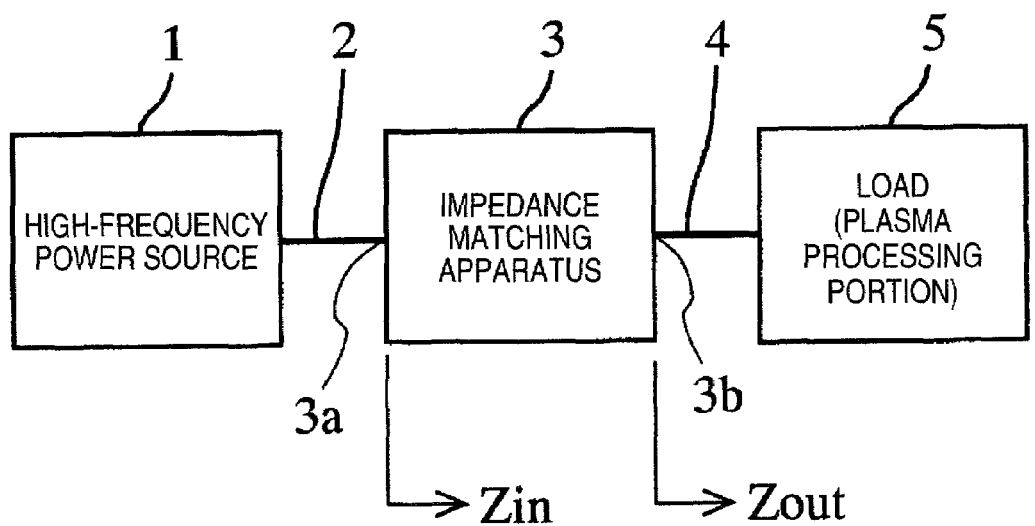
FIG. 4 shows another example of the allowable power values Pp stored in the storing portion 70.
FIG. 5 is a diagram showing an example of a high-frequency power supply system in which the impedance matching apparatus is used.

The storing portion 70 which has been described with reference to FIG. 2 previously stores, for all of the positions which can be taken by the movable portion of the variable impedance element or the combined positions of all of the positions which can be taken by the respective movable portions of the plural variable impedance elements, allowable power values Pp corresponding to the respective positions in an associated manner with the positions of the movable portion. As shown in FIG. 4, however, allowable power values are stored for part of the positions which can be taken by the movable portion of the variable impedance element or combined positions of part of the positions which can be taken by the respective movable portions of the variable impedance elements. This case will be described with reference to FIG. 4.

FIG. 4 shows another example of allowable power values Pp stored in the storing portion 70.

As shown in FIG. 4, even when the movable portion of the variable impedance element can take 0 to 100 positions, for example, the allowable power values Pp may be obtained and stored for each group of 10 positions. In this case, in the case where data (data in which the allowable power values Pp are stored in association with the positions of the movable portion) is stored in the storing portion 70, the abnormality determination can be performed. In the case where the data is not stored, the abnormality decision cannot be performed. For the blank part in which the data is not stored, an allowable power value Pap is obtained from surrounding data. In this case, the same function as in the first embodiment can be attained in the impedance matching apparatus 3.

Accordingly, in the abnormality determining portion 80, when the present position of the movable portion of the variable impedance element at the present time is input, it is determined whether there is data corresponding to the position in the storing portion 70 or not. If there is corresponding data, the abnormality is determined in the same manner as FIG. 1. If the corresponding data does not exist, however, plural positions adjacent to the present position of the movable portion of the variable impedance element among the positions stored in the storing portion 70 are specified, and the minimum value among the allowable power values Pp corresponding to the specified positions is used as the allowable power value Pap to be compared with the input power value Pin.

In the case where the positions of the movable portions of the first variable capacitor C1 and the second variable capacitor C2 at the present time are (C1, C2)=(25, 25), for example, the allowable power values Pp respectively corresponding to the adjacent data (20, 20), (20, 30), (30, 20), and (30, 30) are input, and the minimum value among them is used as an allowable power value Pap. In the case of FIG. 4, therefore, the allowable power value Pap is 900 [W]. Then, the abnormality determination is performed based on the allowable power value Pap.

In this way, the capacity of the storing portion 70 can be reduced. In addition, the number of operation steps can be reduced. Particularly, in the case where the number of positional divisions of the movable portion is increased, that is, the number of variable levels of the impedance is large, the number of data stored in the storing portion 70 is very large. Therefore, the effect of reducing the number of data is significant.

In the above, the example in which two variable impedance elements are provided in the matching portion 10 of the impedance matching apparatus 3 has been described. However, the number of variable impedance elements is not restricted to this. For example, the invention can be applied to a matching portion having a configuration in which a fixed capacitor having a fixed capacitance is provided instead of the first variable capacitor C1 of the matching portion 10 in FIG. 1. In this case, only the data for the second variable capacitor C2 is stored in the storing portion 70.

Alternatively, the invention can be applied to matching portions of other types such as a matching portion having a configuration in which three or more variable impedance elements are disposed in the matching portion 10 of the impedance matching portion 3, or a matching portion having a configuration in which a variable inductor is disposed. In such cases, similarly, allowable power values Pp can be obtained so that a voltage across applied to a variable impedance element does not exceed a withstand voltage value, and a flowing current does not exceed a withstand current value. Then, by using the allowable power values Pp, the breakage of the variable impedance element can be prevented.

Another case where two or more variable impedance elements are driven by one driving portion is considered. For example, instead of the second variable capacitor C2, two variable capacitors are connected in parallel, and they are driven by the second driving portion 32. In this case, when the two variable capacitors connected in parallel are regarded as one variable impedance element, the abnormality can be determined in the same way as described above.

What is claimed is:

1. An impedance matching apparatus, disposed between a high-frequency power source for outputting a high-frequency power and a load, for matching an impedance of the high-frequency power source and an impedance of the load, the apparatus comprising:

a matching unit that includes at least one variable impedance element in which an impedance can be varied by changing a position of a movable portion;

a driving unit that is disposed for each of the variable impedance element and changes the position of the movable portion of the variable impedance element in plural steps within a movable range;

a controlling unit that varies the impedance of the variable impedance element by controlling the driving unit, thereby matching the impedance of the high-frequency power source and the impedance of the load;

an input power acquiring unit that detects or calculates a power value at an input terminal of the matching unit, and outputs the power value as an input power value;

a storing unit that previously stores allowable power values respectively corresponding to intended positions in an associated manner with the positions of the movable portion, while, in a case where the matching unit includes one variable impedance element, plural positions which can be taken by the movable portion of the variable impedance element are intended, and, in a case where the matching unit includes plural variable impedance elements, combined positions of plural positions which can be taken by respective movable portions of the plural variable impedance elements are intended; and an abnormality determining unit that sets, based on a present position of the movable portion and the allowable power values stored in the storing unit, an allowable power value corresponding to the present position of the movable portion, compares the allowable power value with the input power value, and that when the input power value is larger than the allowable power value, determines that it is abnormal and outputs an abnormality signal.

2. The impedance matching apparatus according to claim 1, wherein the storing unit previously stores allowable power values respectively corresponding to intended positions in an associated manner with the positions of the movable portion, while, in the case where the matching unit includes one variable impedance element, all of positions which can be taken by the movable portion of the variable impedance element are intended, and, in the case where the matching unit includes plural variable impedance elements, combined positions of all positions which can be taken by respective movable portions of the plurality of variable impedance elements are intended.

3. The impedance matching apparatus according to claim 1, wherein the controlling unit has a function of, when the impedance matching is attained, or when the impedance matching is assumed to be attained, outputting an impedance matching complete signal, and the abnormality determining unit functions when the impedance matching complete signal is output from the controlling unit.

4. The impedance matching apparatus according to claim 1, wherein the abnormality determining unit externally outputs an allowable power value when the abnormality determining unit determines that it is abnormal, together with the abnormality signal.

5. The impedance matching apparatus according to claim 1, wherein the apparatus further comprises a position detecting unit that is disposed for each of the variable impedance element, detects positional information of the movable portion of the variable impedance element, and outputs the present position of the movable portion based on the detected positional information, and the abnormality determining unit uses the present position of the movable portion output from the position detecting unit.

6. The impedance matching apparatus according to claim 1, wherein the controlling unit has a function of calculating a target position of the movable portion for controlling the driving unit, and a function of outputting the calculated target position of the movable portion as the present position of the movable portion, and the abnormality determining unit uses the present position of the movable portion output from the controlling unit.

7. The impedance matching apparatus according to claim 1, wherein the storing unit previously stores allowable power values respectively corresponding to intended positions in an associated manner with the positions of the movable portion, while, in the case where the matching unit includes one variable impedance element, part of positions which can be taken by the movable portion of the variable impedance element are intended, and, in the case where the matching unit includes plural variable impedance elements, combined positions of part of positions which can be taken by respective movable portions of the plurality of variable impedance elements are intended.

8. The impedance matching apparatus according to claim 7, wherein in a case where an allowable power value corresponding to the present position of the movable portion is included in the allowable power values stored in the storing unit, the abnormality determining unit sets the allowable power value as an allowable power value to be compared with the input power value, and in a case where an allowable power value corresponding to the present position of the movable portion is not included in the allowable power values stored in the storing unit, the abnormality determining unit specifies plural positions adjacent to the present position of the movable portion among the positions of the movable portion stored in the storing unit, and sets a minimum value among the allowable power values corresponding to the specified positions as an allowable power value to be compared with the input power value.

* * * * *